United States Patent
Ishikawa et al.

(10) Patent No.: US 9,565,792 B2
(45) Date of Patent: Feb. 7, 2017

(54) CONNECTION STRUCTURE AND INVERTER

(71) Applicants: Keitaro Ishikawa, Toyota (JP); Akio Kitami, Toyota (JP); Takashi Hamatani, Toyota (JP); Kunihiro Iwata, Ichinomiya (JP); Satoshi Iguchi, Kariya (JP)

(72) Inventors: Keitaro Ishikawa, Toyota (JP); Akio Kitami, Toyota (JP); Takashi Hamatani, Toyota (JP); Kunihiro Iwata, Ichinomiya (JP); Satoshi Iguchi, Kariya (JP)

(73) Assignees: Toyota Jidosha Kabushiki Kaisha, Toyota-shi, Aichi-ken (JP); Denso Corporation, Kariya-shi, Aichi-ken (JP)

( * ) Notice: Subject to any disclaimer, the term of this patent is extended or adjusted under 35 U.S.C. 154(b) by 582 days.

(21) Appl. No.: 14/082,580

(22) Filed: Nov. 18, 2013

(65) Prior Publication Data
US 2014/0140118 A1    May 22, 2014

(30) Foreign Application Priority Data
Nov. 19, 2012 (JP) .................. 2012-253004

(51) Int. Cl.
*H05K 7/20* (2006.01)
*F16L 5/12* (2006.01)
*F16L 21/02* (2006.01)

(52) U.S. Cl.
CPC ............. *H05K 7/20927* (2013.01); *F16L 5/12* (2013.01); *F16L 21/022* (2013.01)

(58) Field of Classification Search
CPC ............ H05K 7/20927; H05K 7/20872; H05K 7/20218; F16L 5/12; F16L 21/022; F16L 23/162; H01L 23/46
USPC .......................... 361/689; 363/141; 285/363
See application file for complete search history.

(56) References Cited

U.S. PATENT DOCUMENTS

| | | | | |
|---|---|---|---|---|
| 5,076,095 | A * | 12/1991 | Erhardt | G01M 3/2853 138/90 |
| 6,178,816 | B1 * | 1/2001 | Katzman | E03B 7/072 285/30 |
| 2005/0133210 | A1 * | 6/2005 | Inagaki | F28D 1/0333 165/152 |
| 2007/0039717 | A1 * | 2/2007 | Inagaki | H01L 23/473 165/80.4 |

(Continued)

FOREIGN PATENT DOCUMENTS

CN    101252307 A    8/2008
JP    6-326980       12/1996

(Continued)

*Primary Examiner* — Anthony Haughton
*Assistant Examiner* — Yahya Ahmad
(74) *Attorney, Agent, or Firm* — Finnegan, Henderson, Farabow, Garrett & Dunner, LLP

(57) ABSTRACT

Two opening through which a refrigerant runs are connected by a first connecting pipe and a second connecting pipe. One end of the first connecting pipe is connected to a first opening by a planar seal. Another end of the first connecting pipe is connected to one end of a second connecting pipe by a shaft seal. Another end of the second connecting pipe is connected to a second opening by a planar seal. An axial direction of a shaft seal is perpendicular to a plane that includes the first opening.

9 Claims, 4 Drawing Sheets

(56) References Cited

U.S. PATENT DOCUMENTS

| | | | | |
|---|---|---|---|---|
| 2008/0198548 A1* | 8/2008 | Nakamura | ......... | H05K 7/20927 |
| | | | | 361/689 |
| 2010/0213703 A1* | 8/2010 | McCann | ................ | B23B 49/02 |
| | | | | 285/220 |
| 2015/0152987 A1* | 6/2015 | Ishikawa | .................. | F16L 5/12 |
| | | | | 285/350 |

FOREIGN PATENT DOCUMENTS

| JP | 2001-108178 | 4/2001 |
|---|---|---|
| JP | 2003-232484 | 8/2003 |
| JP | 2008-220033 | 9/2008 |
| JP | 2012-54444 | 3/2012 |
| JP | 2012-64724 | 3/2012 |

* cited by examiner

CONNECTION STRUCTURE AND INVERTER

INCORPORATION BY REFERENCE

The disclosure of Japanese Patent Application No. 2012-253004 filed on Nov. 19, 2012 including the specification, drawings and abstract is incorporated herein by reference in its entirety.

BACKGROUND OF THE INVENTION

1. Field of the Invention

The present invention relates to a connection structure for connecting two openings in and out of which a fluid flows by a rigid connecting pipe and also to an inverter that utilizes the connection structure.

2. Description of Related Art

It has been a common practice to connect two openings in and out of which a fluid flows by a rigid connecting pipe. For example, an opening of a cooler, such as an inverter cooler or a motor cooler, is connected to an opening of a radiator by a pipe in an electric vehicle. Japanese Patent Application Publication No. 2012-054444 (JP 2012-054444 A) discloses a technique to reduce flow path resistance in a U-shaped connecting pipe that connects two openings, for example. The invention disclosed in Japanese Patent Application Publication No. 2003-232484 (JP 2003-232484 A) includes: a connector section having a stop section that is attachable to a cooling system and an elbow section at which a flow path is bent; and a pipe section that is continuous with the elbow section. In addition, JP 2003-232484 A discloses a flow path port for the cooling system in which the pipe section and the connector section are integrally molded by die casting. This technique exhibits an excellent effect in terms of workability of the flow path port.

SUMMARY OF THE INVENTION

When two openings in and out of which a fluid flows are connected by rigid connecting pipes, there is a possibility that the two openings are displaced from original design positions. In such a case, if the connecting pipes for connecting the two openings are forcedly attached, an excessive stress is applied to the connecting pipes, thereby accelerating deterioration of the pipes. This specification provides a technique that allows displacements of the openings while avoiding application of the excessive stress to the connecting pipes when the two openings are connected by the rigid connecting pipes.

A seal member that has elasticity in a portion in which the opening and the pipe are connected is used to prevent leakage of the fluid when the pipe is connected to the opening in and out of which the fluid flows. For example, there are two sealing methods. One of the sealing methods is a method of disposing the seal member in a periphery of the opening, and the seal member is called a planar seal. For example, the planar or ring-shaped seal member is disposed on a surface around the opening, and a flange that is provided at one end of the connecting pipe is connected to the opening while the seal member is held between the flange and the opening. The other sealing method is a method of disposing a cylindrical or ring-shaped seal member between an inner periphery of a hole that is continuous with the opening and an outer periphery of the pipe, and the seal member is called a shaft seal. In this case, one end of the connecting pipe is inserted in the opening. In this specification, to dispose the planar seal member in a connecting section between the opening and the pipe (or the pipe and the pipe) is defined as "connecting together with the planar seal". In addition, to dispose the shaft seal member in a connecting section between the opening and the pipe (or the pipe and the pipe) is defined as "connecting together with the shaft seal".

When the opening and the pipe are connected together with the planar seal, sealing by the seal member is maintained even with slight movement of the pipe in a plane that includes the opening (in an opening surface). In other words, it is possible with the planar seal to secure a margin that allows the movement of the one end of the connecting pipe in the opening surface while maintaining the sealing. When the opening and the pipe are connected together with the shaft seal, the sealing by the seal member is maintained even with the slight movement of the pipe in an axial direction of the shaft seal (a direction of a center line of the opening). In other words, it is possible with the shaft seal to secure a margin that allows the movement of the one end of the connecting pipe in a direction perpendicular to the opening surface (the axial direction of the shaft seal, for example) while maintaining the sealing. Accordingly, the connecting pipe is allowed to move in a direction parallel to the opening surface and also in the direction perpendicular to the opening surface by combining the planar seal and the shaft seal. In other words, it is possible by the combination of the planar seal and the shaft seal to secure a margin that allows the three-dimensional movement of the connecting pipe with respect to the opening in the connecting section between the connecting pipe and the opening. It should be noted that "movement of the pipe" means the movement thereof for a distance that approximately corresponds to a positional error of the opening. The technique disclosed herein is based on the above principle.

In a connection structure according to an aspect of the present invention, a first opening and a second opening through which the fluid flows are connected to the rigid connecting pipes. The connecting pipes include a first connecting pipe and a second connecting pipe. The first connecting pipe is connected at one end to the first opening by the planar seal. Another end of the first connecting pipe and one end of the second connecting pipe are connected by the shaft seal. Another end of the second connecting pipe is connected to the second opening by the planar seal. The axial direction of the shaft seal is perpendicular to a plane that includes the first opening. In other words, the one end of the first connecting pipe is connected to the first opening by the planar seal. The other end of the first connecting pipe is connected to the one end of the second connecting pipe by the shaft seal. The other end of the second connecting pipe is connected to the second opening by the planar seal. The axial direction of the shaft seal is perpendicular to an opening surface of the first opening. With such a structure, the one end of the second connecting pipe is allowed for the three-dimensional movement with respect to the first opening for the distance corresponding to the positional error of the opening. Even when the first opening is displaced in any three-dimensional direction, the relative displacement thereof to the other end of the second connecting pipe is allowed by the margin in the opening surface that is realized by the planar seal and also by the margin in the axial direction that is realized by the shaft seal. In other words, the stress applied to the first and second connecting pipes is alleviated by combining the planar seal and the shaft seal. The axial direction of the shaft seal for the first connecting pipe and the second connecting pipe does not have to correspond to the perpendicular direction of the planar seal in a strict manner. The axial direction of the shaft seal for the first connecting pipe and the second connecting pipe only needs to be perpendicular to a degree that allows the movement of the second connecting pipe in an outer direction of the opening surface.

In the connection structure according to the above aspect of the present invention, the first connecting pipe may be a bush that includes a cylindrical section and a flange. The cylindrical section is inserted in the first opening. The second connecting pipe is inserted in the cylindrical section through the shaft seal. The flange is provided on an outer periphery of the cylindrical section. The flange contacts the periphery of the first opening through the planar seal. In other words, the second connecting pipe is inserted in the hush from the flange side (the one end of the first connecting pipe) through the shaft seal. The flange of the bush contacts the periphery of the first opening through the planar seal. This bush (first connecting pipe) is a member that serves as a joint to connect between the first opening and the second connecting pipe. That is, the first connecting pipe may be a straight pipe having a flange at the one end.

An inverter according to an aspect of the present invention includes: a housing that has a first opening and a second opening; a first connecting pipe that is connected to the first opening; and a second connecting pipe that is connected to the second opening. The first connecting pipe is connected to the second connected pipe. A first planar seal member is disposed between a side surface of the housing and one end of the first connecting pipe. A second planar seal member is disposed between a side surface of the housing and another end of the second connecting pipe. A first shaft seal member is disposed between another end of the first connecting pipe and one end of the second connecting pipe. An axial direction of the shaft seal member is perpendicular to a plane including the first opening. In other words, the one end of the first connecting pipe is connected to the first opening through the planer seal. The other end of the first connecting pipe is connected to the one end of the second connecting pipe through the shaft seal. The other end of the second connecting pipe is connected to the second opening through the planar seal. The axial direction of the shaft seal is perpendicular to the opening surface of the first opening. Such a structure allows three-dimensional movement of the one end of the second connecting pipe with respect to the first opening for a positional error of the opening. Even when the first opening is displaced in any three-dimensional direction, the displacement thereof relative to the other end of the second connecting pipe is allowed by a margin in the opening surface that is realized by the planar seal and also by a margin in the axial direction that is realized by the shaft seal. In other words, a stress applied to the first and second connecting pipes is alleviated by the combination of the planar seals and the shaft seal. The axial direction of the shaft seal for the first connecting pipe and the second connecting pipe does not have to correspond to the perpendicular direction of the planar seal in a strict manner. The axial direction of the shaft seal for the first connecting pipe and the second connecting pipe only needs to he perpendicular to a degree that allows the movement of the second connecting pipe in an outer direction of the opening surface.

In the inverter according to the above aspect of the present invention, the first connecting pipe may be a bush. The bush may include a cylindrical section (the other end of the first connecting pipe) that is inserted in the first opening and a flange provided on an outer periphery of the cylindrical section. The one end of the second connecting pipe is inserted in the cylindrical section. The first shall seal is disposed between an inner peripheral surface of the cylindrical section and an outer peripheral surface of the second connecting pipe. The first planar seal member is disposed between the flange and the side surface of the housing. In other words, the second connecting pipe is inserted in the cylindrical section of the hush from the flange side (the one end of the first connecting pipe) through the shaft seal. The flange contacts the periphery of the first opening through the planar seal. This bush (first connecting pipe) is a member that serves as a joint to connect between the first opening and the one end of the second connecting pipe. That is, the first connecting pipe is a straight pipe having the flange at the one end.

In the inverter according to the above aspect of the present invention, the first connecting pipe and the second connecting pipe may be formed of a rigid body.

The inverter according to the above aspect of the present invention may include a first housing and a second housing. The first housing is provided with the first opening through Which the refrigerant flows. The second housing is provided with the second opening through which the refrigerant flows. The first opening and the second opening are connected by the first connecting pipe and the second connecting pipe. This specification also provides a novel inverter in which the two housings are combined and in which the openings respectively provided in the two housings are connected by the above connection structure.

The inverter according to the above aspect of the present invention may include a stacked cooling unit. The stacked cooling unit has plural cooling plates that hold a heating unit therebetween and a connecting pipe that connects the adjacent cooling plates. The first connecting pipe is connected to a rigid tube that extends from the cooling plate positioned at an end of the stacked cooling unit. The inverter houses the stacked cooling unit in the first housing. The second housing is provided with a refrigerant path for cooling a device (including the stacked cooling unit) that is housed in the first housing. The first connecting pipe and the rigid tube may he connected to each other through the first opening.

In the inverter according to the above aspect of the present invention, the rigid tube and the cooling plate may be made of a same material, and thickness of the cooling plate may be thinner than that of the rigid tube. In such a structure, when the stacked cooling unit is displaced from an original design position with respect to the first opening, the thinner cooling plate is deformed before the tube is deformed. Therefore, the stress applied to the tube is alleviated.

In the inverter according to the above aspect of the present invention, a second shaft seal member may be disposed between the inner peripheral surface at the other end of the first connecting pipe and an outer peripheral surface of the rigid tube, and the first shaft seal may he disposed between the inner peripheral surface at the other end of the first connecting pipe and the outer peripheral surface at the one end of the second connecting pipe.

The details of the technique disclosed herein and further improvements thereof will be provided in the following "DETAILED DESCRIPTION OF EMBODIMENTS".

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
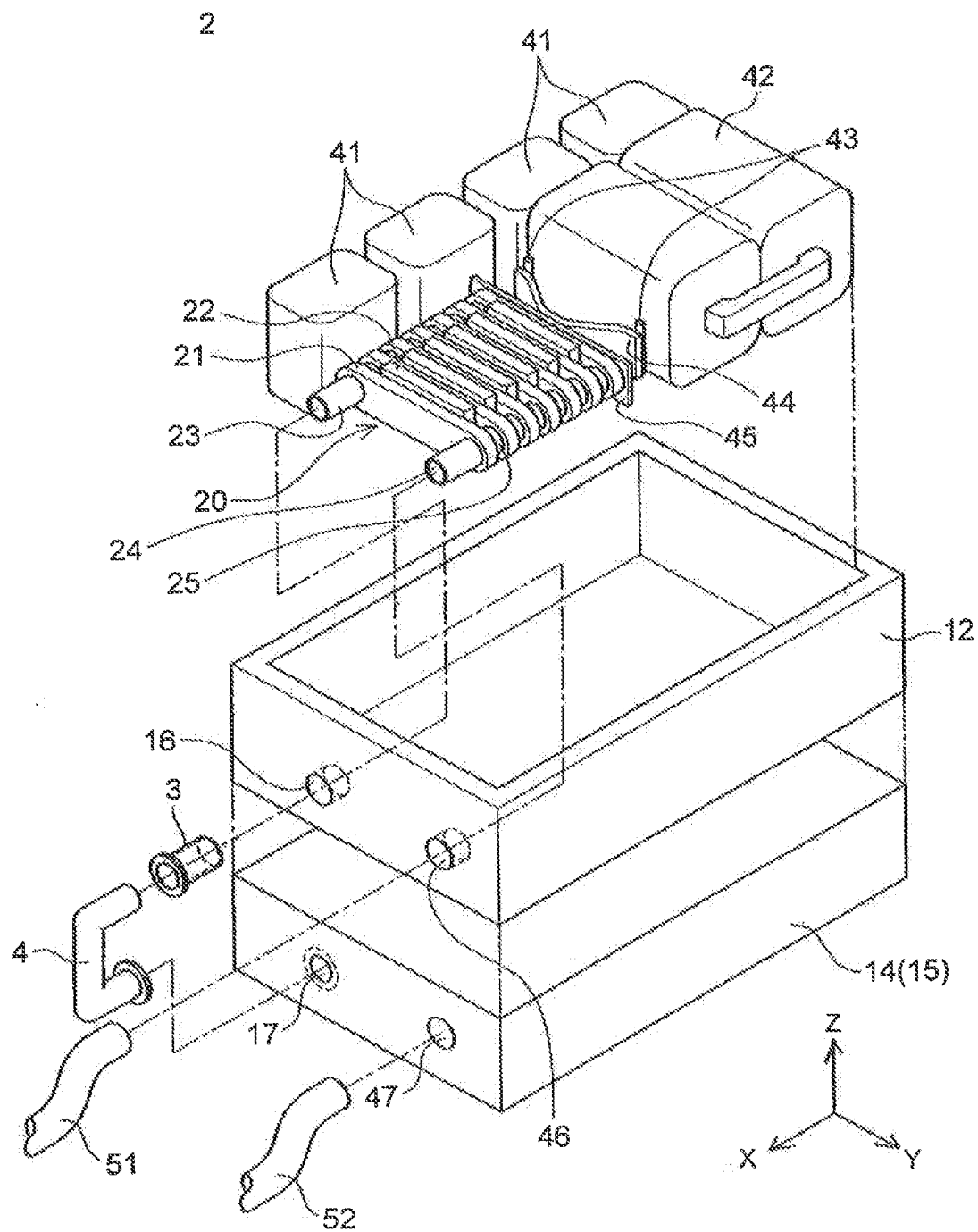
FIG. 1 is an exploded perspective view of an inverter according to an embodiment.
Figure 2:
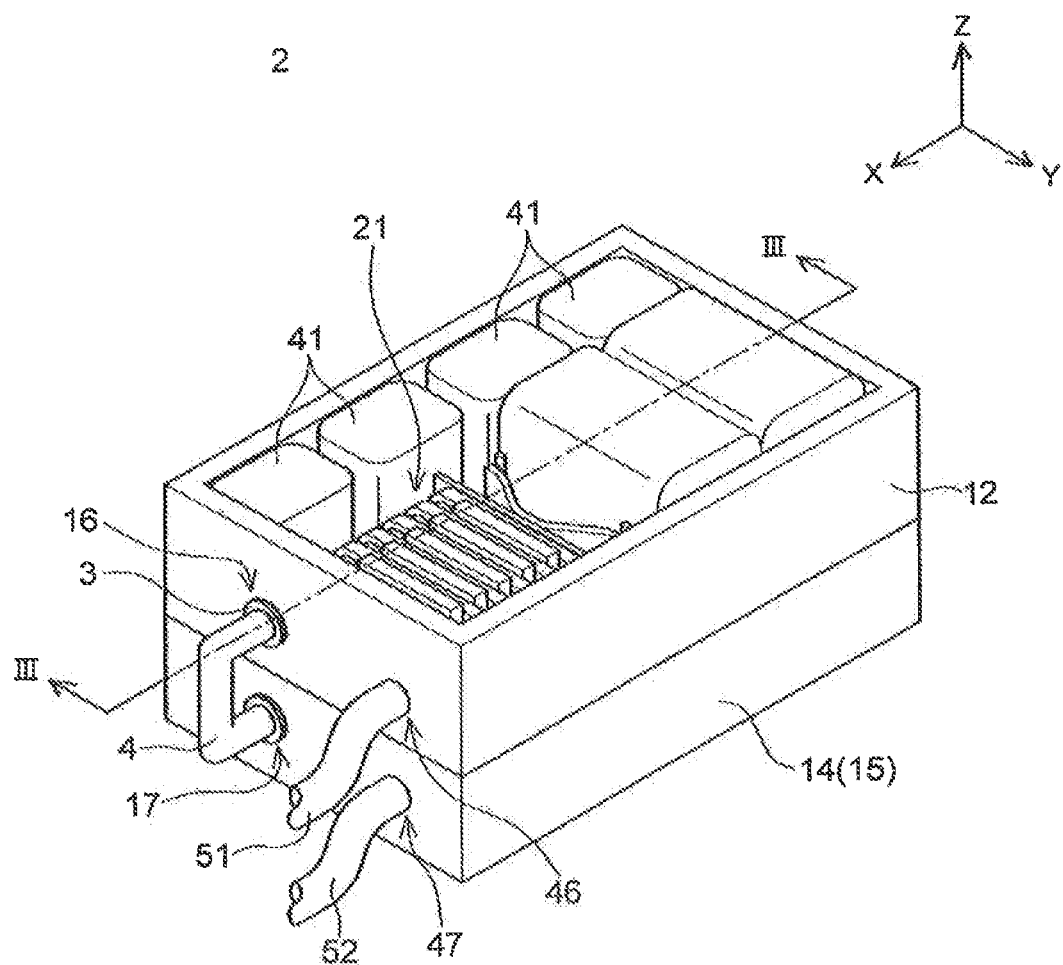
FIG. 2 is a perspective view of the inverter (in a state that a cover is removed)
Figure 3:
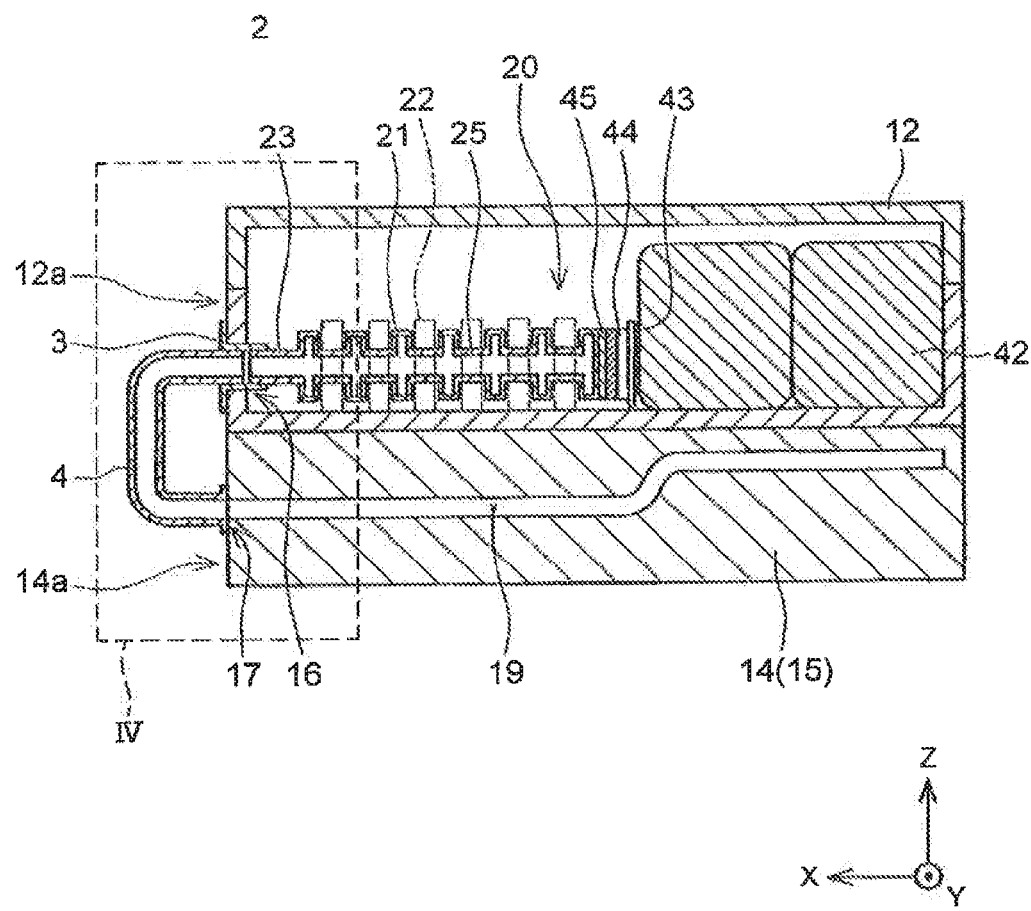
FIG. 3 is a cross-sectional view that is taken along the line III-III in FIG. 2.

A description will hereinafter be made on a connection structure and an inverter according to an embodiment with reference to the drawings. FIG 1 is an exploded perspective view of an inverter 2, and FIG. 2 is a perspective view of the inverter 2. A cover of the inverter is not shown for a better understanding of the embodiment. FIG. 3 is a cross-sectional view that is taken along the line III-III in FIG. 2 (a cross-sectional view that runs through a second connecting pipe 4 vertically). The inverter 2 is installed in an electric vehicle. The inverter 2 is a device to boost voltage of direct current of a battery and then convert the boosted direct current to alternating current suitable for driving a traveling motor. The inverter 2 includes a voltage converter circuit and an inverter circuit. The inverter 2 is configured by a stacked cooling unit 20 in which switching elements are integrated for cooling, a smoothing capacitor 41 for smoothing a high current for driving the motor, a reactor 42 that is used for the voltage converter circuit, a cooler 15 for cooling the reactor 42 and the smoothing capacitor 41, and a circuit board that mounts a control circuit for controlling the switching elements. The switching element contains a transistor such as an IGBT and a diode connected in anti-parallel to the transistor. Although the circuit board is disposed above the stacked cooling unit 20 and the reactor 42, it is not shown in the drawings. FIG. 2 shows a state that the cover is removed for a better understanding of a layout on the inside of an inverter housing.

The inverter 2 has two independent housings (a first housing 12 and a second housing 14). The first housing 12 houses units such as the reactor 42 and the stacked cooling unit 20. The second housing 14 is the cooler 15 itself The inverter 2. includes two coolers. One of the coolers is the cooler 15 for cooling the reactor 42 and the capacitor 41. The other cooler is the stacked cooling unit 20 that is integrated with a plurality of power cards 22 in which the switching elements are housed. Because the cooler 15 is fixed to a bottom surface of the first housing 12, the coolers are integrated as a whole in the inverter 2.

The stacked cooling unit 20 is configured such that the plurality of power cards 22 in which the switching elements are molded and a plurality of cooling plates 21 of flat type through which a refrigerant runs are stacked alternately. The cooling plate 21 is hollow and is provided with through holes at both sides in a longitudinal direction of the cooling plate 21 (that is, both sides of the power card 22). The through holes of the adjacent cooling plates 21 are connected by a connecting pipe 25. The cooling plate 21 at an end of a stacking structure is connected to two tubes 23, 24, each of which is made of a rigid body. The stacked cooling unit 20 is housed in the first housing 12, and the tubes 23, 24 are respectively connected to openings 16, 46 provided in a sidewall of the first housing 12. The refrigerant is supplied to the stacked cooling unit 20 through the opening 46. The refrigerant supplied to the stacked cooling unit 20 is discharged from the stacked cooling unit 20 through the other opening 16. The opening 46 is connected to a supply pipe 51 for supplying the refrigerant from the outside of the housing and is also connected to the tube 24 from the inside of the housing. The opening 16 is connected to the tube 23 from the inside of the housing and is also connected to a first connecting pipe 3 and a second connecting pipe 4 from the outside of the housing. The second connecting pipe 4 is a U-shaped pipe and is connected at its other end (a lower end in FIGS. 1 and 2) to an opening 17 of the second housing 14, The second housing 14 is provided with an opening 47 to which a refrigerant discharging pipe 52 is connected.

The refrigerant that is supplied from the outside of the inverter 2 through the refrigerant supply pipe 51 runs through the opening 46 and the tube 24 and is then supplied to the stacked cooling unit 20. The refrigerant flowed in from the tube 24 is supplied to all of the cooling plates 21 through the one connecting pipe 25 that is connected to the cooling plates 21. The refrigerant flows inside the cooling plate 21 in the longitudinal direction of the cooling plate 21 to cool the power card 22 that is in contact with the cooling plate 21. The refrigerant that has absorbed the heat of the power card 22 flows into the other connecting pipe 25 connected to the cooling plates 21. The refrigerant that has flown into the other connecting pipe 25 runs through the tube 23 and the opening 16 and is discharged from the first housing 12. The refrigerant is subsequently introduced to the second housing 14 (that is, the cooler 15) through the first connecting pipe 3 and the second connecting pipe 4. A flow path 19 for the refrigerant (see FIG. 3) is provided in the second housing 14 in a position right below the reactor 42 and the capacitor 41 that are installed in the first housing 12. The refrigerant cools the reactor 42 and the capacitor 41 while flowing through the flow path 19. In the end, the refrigerant is discharged from the second housing 14 (that is, the cooler 15) through the refrigerant discharging pipe 52 that is connected to the opening 47. A cooling system that includes a radiator for cooling the refrigerant and a pump for circulating the refrigerant is provided on the outside of the inverter 2. The refrigerant that has cooled the inverter 2 is cooled in the radiator and is sent to the inverter 2 again.

In the stacked cooling unit 20, an insulating plate 45 and a leaf spring 44 are further stacked onto an end of a stacked body. The stacked cooling unit 20 is supported by an inner wall of the housing 12 and struts 43. The stacked cooling unit 20 is applied with a load in a stacked direction thereof by the leaf spring 44 and is supported by the housing 12. The load of the leaf spring 44 brings the cooling plates 21 and the power cards 22, which are stacked alternately, into close contact with each other. Accordingly, the heat is effectively transferred between the cooling plates 21 and the power cards 22. Meanwhile, there is a possibility that the stacking of the leaf spring 44 lowers the mounting accuracy of the stacked cooling unit 20 and consequentially causes a slight error in a mounting position of the stacked cooling unit 20. The error appears as displacements of relative positions of the tube 23 (or the tube 24) and the opening 16 (or the opening 46) to each other. If the tube 23 is displaced from the opening 16, the tube 23 may be applied with an excessive stress when connected to the opening 16. In the inverter 2 of this embodiment, the stress that is generated by such a displacement and applied to the tube 23 is alleviated. A structure for alleviating will be described later.

The inverter 2 has the two independent housings (the first housing 12 and the second housing 14), and each of the housings is provided with the openings (the openings 16, 46, 17, 47) through which the refrigerant runs. The opening 16 of the first housing 12 and the opening 17 of the second housing 14 are connected by the two connecting pipes (the first connecting pipe 3 and the second connecting pipe 4). A seal member is disposed in a connecting section between the first connecting pipe 3 and the opening 16, a connecting section between the first connecting pipe 3 and the tube 23, a connecting section between the first connecting pipe 3 and the second connecting pipe 4, and a connecting section between the second connecting pipe 4 and the opening 17. However, the seal members are not shown in FIGS. I to 3. A description will be made on the seal member with reference to FIG. 4.

Figure 4:
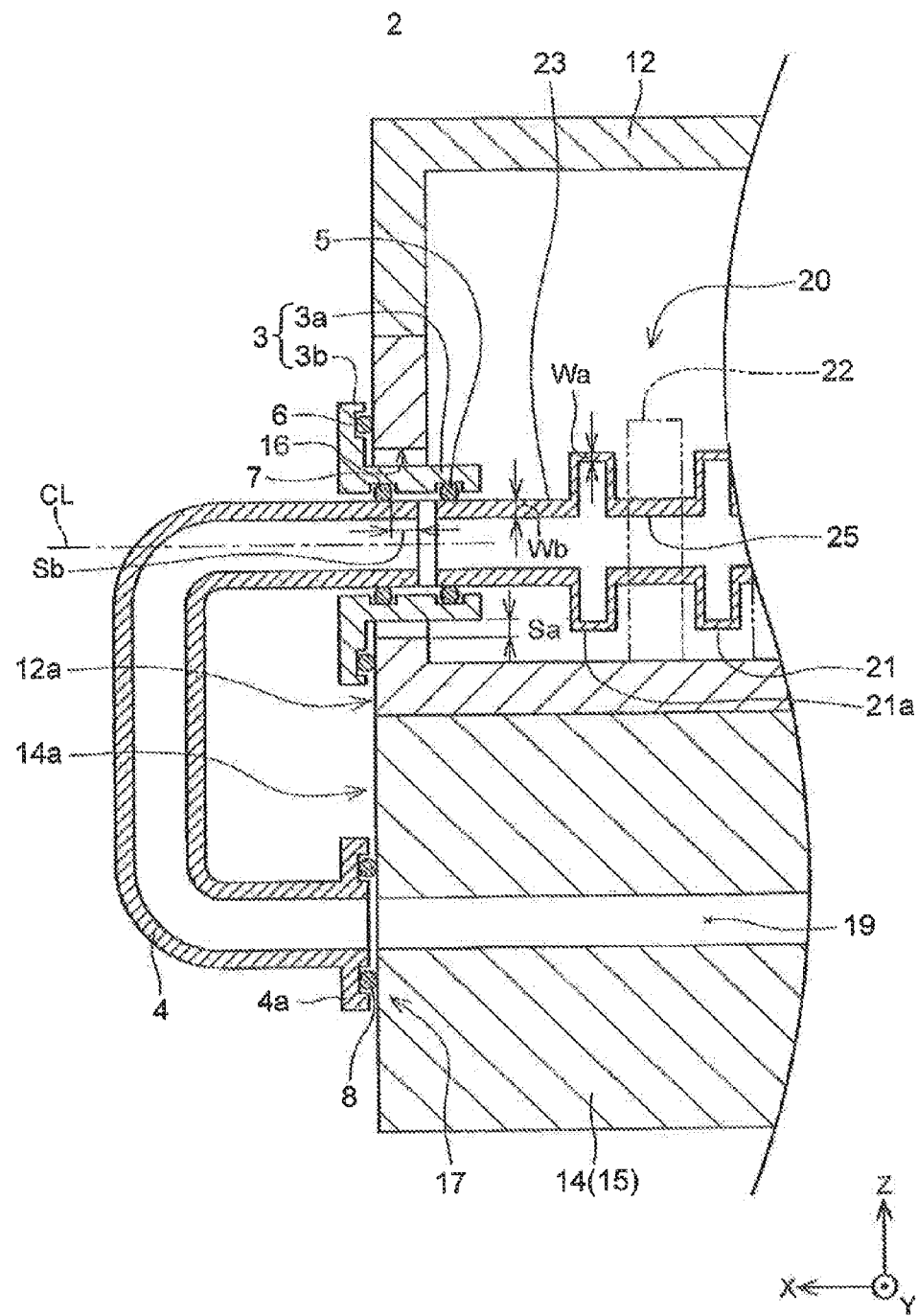
FIG. 4 is an enlarged cross-sectional view of a portion enclosed by a broken line IV in FIG. 3.

A description is now made on the two connecting pipes (the first connecting pipe 3 and the second connecting pipe 4) that connect the opening 16 and the opening 17 and a connection structure of these with reference to FIG. 4. FIG. 4 is an enlarged view of a region enclosed by a broken line IV in the cross-sectional view of FIG. 3. In other words, FIG. 4 is a cross-sectional view of a plane including centerlines of the opening 16 and the opening 17. In FIG. 4, the power cards 22 are shown in a virtual line.

The first connecting pipe 3 is fitted into the opening 16 of the first housing 12. The first connecting pipe 3 is configured by a cylindrical section 3a inserted through the opening 16 and a flange 3b provided at one end (left end in FIG. 4) of the cylindrical section 3a. The flange 3b abuts against a side surface 12a of the first housing 12 around the opening 16. A surface of the flange 3b that faces the side surface 12a of the first housing 12 is provided with a groove in a periphery of the cylindrical section 3a. An O-ring 6 is fitted into the groove. When the first connecting pipe 3 is inserted in the opening 16, the O-ring 6 is positioned between the flange 3b and the side surface 12a and seals a space between the flange 3b and the side surface 12a, In other words, the one end of the first connecting pipe 3 (the left end of the first connecting pipe 3 in FIG. 4) is connected to the opening 16 together with a planar seal. Although it is not shown, the flange 3b is fixed to the side surface 12a by a bolt.

The tube 23 of the stacked cooling unit 20 is fitted into the cylindrical section 3a of the first connecting pipe 3. The cylindrical section 3a is provided with a groove in an inner periphery thereof in a circumferential direction. An O-ring 5 is fitted into the move. When the tube 23 is inserted in the cylindrical section 3a, the O-ring 5 is positioned between an inner peripheral surface of the cylindrical section 3a and an outer peripheral surface of the tube 23 and seals a space between the inner peripheral surface of the cylindrical section 3a and the outer peripheral surface of the tube 21 In other words, the other end of the first connecting pipe 3 (a right end of the first connecting pipe 3 in FIG. 4) is connected to the tube 23 of the stacked cooling unit 20 together with a shaft seal. More specifically, the O-ring 5 is positioned between the inner peripheral surface at the other end of the first connecting pipe 3 (the right end of the first connecting pipe 3 in FIG. 4) and the outer peripheral surface of the tube 23.

One end of the second connecting pipe 4 is fitted into the inside of the cylindrical section 3a of the first connecting pipe 3. The cylindrical section 3a is provided with another groove in the inner peripheral surface thereof in the circumferential direction. An O-ring 7 is fitted into the groove. When the one end of the second connecting pipe 4 is inserted in the cylindrical section 3a, the O-ring 7 is positioned between the inner peripheral surface of the cylindrical section 3a and an outer peripheral surface of the second connecting pipe 4 and seals a space between the inner peripheral surface of the cylindrical section 3a and the outer peripheral surface of the second connecting pipe 4. In other words, the other end of the first connecting pipe 3 is connected to the one end of the second connecting pipe 4 (an upper right end of the second connecting pipe in FIG. 4) together with a shaft seal. More specifically, the O-ring 7 is positioned between the inner peripheral surface at the other end of the first connecting pipe 3 and the outer peripheral surface at the one end of the second connecting pipe 4 (the upper right end of the second connecting pipe in FIG. 4). In FIG. 4, "the other end of the first connecting pipe 3" includes a portion where the inner peripheral surface of the cylindrical section 3a and the outer peripheral surface of the tube 23 are sealed as well as a portion where the inner peripheral surface of the cylindrical section 3a and the outer peripheral surface of the second connecting pipe 4 are sealed.

The other end of the second connecting pipe 4 (a lower right end of the second connecting pipe 4 in FIG. 4) is connected to the opening 17 of the second housing 14 (the cooler 15). The other end of the second connecting pipe 4 is provided with a flange 4a. The flange 4a faces a periphery of the opening 17 on a side surface 14a of the second housing 14 (the cooler 15). A surface of the flange 4a that faces the side surface 14a of the second housing 14 is provided with a groove around the opening 17. An O-ring 8 is fitted into the groove. When the second connecting pipe 4 is connected to the opening 17, the O-ring 8 is positioned between the flange 4a and a surface around the opening 17 (the side surface 14a of the second housing 14) and seals a space between the flange 4a and the side surface 14a. In other words, the other end of the second connecting pipe 4 is connected to the opening 17 together with a planar seal. Although it is not shown, the flange 4a is fixed to the side surface 14a by a bolt.

The first connecting pipe 3 and the second connecting pipe 4 are formed of a rigid body. Typically, the first connecting pipe 3 and the second connecting pipe 4 are made of metal such as aluminum or a resin. The O-rings 5, 6, 7, 8 are made of rubber or silicon, for example. The first connecting pipe 3 that has the cylindrical section 3a and the flange 3b at the one end of the cylindrical section 3a corresponds to a so-called bush (bearing cylinder) of a straight pipe.

As shown in. FIG. 4, an outer radius of the first connecting pipe 3 is smaller than a radius of the opening 16 by a distance Sa. In other words, a space Sa is secured between the cylindrical section 3a of the first connecting pipe 3 and the inner periphery of the opening 16. The first connecting pipe 3 can move in a direction parallel to an opening surface (a Y-Z plane direction in the drawing) by the space Sa. Meanwhile, the O-ring 6 functions as the planar seal between the first connecting pipe 3 and the opening 16. Accordingly, even when the first connecting pipe 3 moves in the direction parallel to the opening surface, the planar seal by the O-ring 6 maintains its function. The first connecting pipe 3 is fixed to the first housing 12 by the bolt. A bolt hole provided in the flange 3b of the first connecting pipe 3 is larger than an outer diameter of the bolt and allows the displacement of the flange 3b. The space Sa corresponds to a margin that allows the first connecting pipe 3 to move in the direction parallel to the opening surface. The space Sa is relatively enlarged in FIG. 4 for a better understanding. It should be noted that the actual size of the space Sa may approximately be equal to a dimensional error, which will be described below.

In addition, even when the one end (upper right end in FIG. 4) of the second connecting pipe 4 that is fitted into the cylindrical section 3a of the first connecting pipe 3 moves by a distance Sb shown in FIG. 4, the O-ring 7 remains in a position between the inner peripheral surface of the cylindrical section 3a and the outer peripheral surface at the one end of the second connecting pipe 4. In other words, the second connecting pipe 4 can move by the distance Sb in an axial direction of the shaft seal (a direction of an axis CL in FIG. 4 and an X direction in the drawing) while maintaining the shaft seal by the O-ring 7. The space Sb corresponds to a margin that allows the second connecting pipe 4 to move in the direction perpendicular to a plane including the opening 16.

As a result, the one end of the second connecting pipe 4 can move by the distance Sa in the direction parallel to the opening surface of the opening 16 while maintaining the sealing with respect to the opening 16 through the first connecting pipe 3. Alternatively, the one end of the second connecting pipe 4 can move by the distance Sb in the axial direction of the shaft seal while maintaining the sealing with respect to the opening 16 through the first connecting pipe 3. Therefore, even if the relative positions of the opening 16 and the opening 17 to each other are displaced from the original positions due to the dimensional error or the like, these two openings can be connected by the first connecting pipe 3 and the second connecting pipe 4 without any difficulty In other words, even when the opening 16 and the opening 17 that have been displaced from the original positions due to the dimensional error or the like are connected by the first connecting pipe 3 and the second connecting pipe 4, an excessive stress is not generated on the connecting pipes 3, 4. Such an effect can be obtained by the connection structure in which the one end of the first connecting pipe 3 is connected to the opening 16 together with the planar seal and the other end thereof is connected to the second connecting pipe 4 together with the shaft seal.

The one end (upper right end in FIG. 4) of the U-shaped second connecting pipe 4 is connected to the first connecting pipe 3 together with the shaft seal, and the other end (lower right end in FIG. 4) thereof is connected to the opening 17 together with the planar seal. The U-shaped connecting pipe 4 is allowed at the one end to move in the axial direction of the shaft seal (in the direction of the axis CL in the drawing) while maintaining the shaft seal. The U-shaped connecting pipe 4 is also allowed at the other end to move in the direction parallel to the opening surface (Y-2 plane direction in the drawing) while maintaining the planar seal. In other words, the U-shaped second connecting pipe 4 can also allow the three-dimensional displacements of relative positions of the opening 16 of the first housing 12 and the opening 17 of the second housing 14. The flange 4a of the second connecting pipe 4 is fixed to the second housing 14 by the bolt. A bolt hole provided in the flange 4a is larger than an outer diameter of the bolt and allows the displacement of the flange 4a (that is, the displacement of the second connecting pipe 4).

As shown in FIG, 4, thickness Wa of the cooling plate 21 (thickness Wa of a tubular pipe) is thinner than thickness Wb of the tube 23 (thickness Wb of a plate member that forms the tube 23) in the stacked cooling unit 20. It should be noted that the tube 23 and the cooling plates 21 are made of a same material (typically aluminum). Therefore, the cooling plate 21 has lower rigidity than the tube 23. The mounting position of the stacked cooling unit 20 with respect to the opening 16 (a position at the end of the cooling plates 21a to which the tube 23 is attached) is possibly displaced from an original design position due to the dimensional error or the like. Even when the tube 23 is inserted in the opening 16 in a state that the mounting position of the stacked cooling unit 20 is displaced from the original design position, deflection of the tube 23 can be suppressed to be small. It is because the cooling plate 21 with the low rigidity is deflected before the tube 23 is deflected. In other words, it is possible to suppress the stress generated on the tube 23.

A description is now made on points to be noted regarding the techniques described for the embodiment. In the inverter 2 of the embodiment, the O-ring is used to seal between the connecting pipes 3, 4 and the openings. As the planar seal, a planar seal member may be used instead of the O-ring. Also, as the shaft seal, a cylindrical seal member may be used instead of the O-ring.

In the embodiment, the axial direction of the first connecting pipe 3 and the second connecting pipe 4 that are connected together with the shaft seal (the axis CL in the drawing) is perpendicular to the plane including the opening 16 (Y-Z plane in the drawing). However, it is unnecessary for the axis CL to be strictly perpendicular to the plane including the opening 16. The axis CL may be perpendicular to the plane including the opening 16 to a degree that the second connecting pipe 4 can move in an out-of-plane direction of the plane including the opening 16.

As shown in FIG. 4, the thickness Wa of the cooling plates 21 is thinner than the thickness Wb of the tube 23 in the stacked cooling unit 20. The thickness of the cooling plate 21 only needs to be thinner than the tube 23 in a periphery of a portion where the cooling plate 21 is connected to the tube 23. It is because the stress generated on the tube 23 can be reduced if the cooling plate 21 is deflected in the portion connected to the tube 23 before the tube 23 is deflected.

The opening 16 provided in the first housing 12 corresponds to an example of "the first opening". The opening 12 provided in the second housing 14 corresponds to an example of "the second opening". The connection between the opening 16 and the one end (left end in the drawing) of the first connecting pipe 3 together with the planar seal, the connection between the opening 17 and the other end (lower right end in the drawing) of the second connecting pipe 4 together with the planar seal, the connection between the other end (right end in the drawing) of the first connecting pipe 3 and the one end (upper right end in the drawing) of the second connecting pipe 4 together with the shaft seal, and the axis of the shall seal (axis CL in the drawing) being perpendicular to the opening surface of opening 16 correspond to the embodiment of the connection structure and the inverter disclosed in this specification.

The embodiment of the present invention has been described in detail so far. However, it is merely an example and has no intention to limit the scope of the claims. The techniques disclosed in the claims include various modifications and changes that are made to the specific example described above. The technical elements that are described in this specification and the drawings demonstrate technical utility when used singly or in various combinations, and thus are not limited to the combinations described in the claims of the original application. The techniques that are illustrated in this specification and the drawings can achieve a plurality of objects simultaneously, and the achievement of one object thereof itself has technical usefulness.

What is claimed is:

1. A connection structure for connecting a first opening and a second opening through which a fluid flows to rigid connecting pipes, the connection structure comprising:
   a first connecting pipe, one end of the first connecting pipe being connected to the first opening by a planar seal; and
   a second connecting pipe, one end of the second connecting pipe being connected to another end of the first connecting pipe by a shaft seal, another end of the second connecting pipe being connected to the second opening by a planar seal, and an axial direction of the shaft seal being perpendicular to a plane including the first opening.

2. The connection structure according to claim 1, wherein
the first connecting pipe is a bush configured by a cylindrical section and a flange,
the cylindrical section is inserted in the first opening while the second connecting pipe is inserted in the cylindrical section through the shaft seal, and
the flange is provided on an outer periphery of the cylindrical section and contacts a periphery of the first opening through the planar seal.

3. An inverter comprising:
a housing having a first opening and a second opening;
a first connecting pipe connected to the first opening;
a second connecting pipe connected to the second opening, the first connecting pipe being connected to the second connecting pipe;
a first planar seal member disposed between a side surface of the housing and one end of the first connecting pipe;
a second planar seal member disposed in a connecting section between the side surface of the housing and another end of the second connecting pipe; and
a first shaft seal member disposed between another end of the first connecting pipe and one end of the second connecting pipe, an axial direction of the first shaft seal member being perpendicular to a plane including the first opening.

4. The inverter according to claim 3, wherein
the first connecting pipe is a bush,
the bush is configured by a cylindrical section inserted in the first opening and a flange provided on an outer periphery of the cylindrical section,
the one end of the second connecting pipe is inserted in the cylindrical section,
the first shaft seal member are disposed between an inner peripheral surface of the cylindrical section and an outer peripheral surface of the second connecting pipe, and
the first planar seal member is disposed between the flange and the side surface of the housing.

5. The inverter according to claim 3, wherein
the first connecting pipe and the second connecting pipe are rigid bodies.

6. The inverter according to claim 3, wherein
the housing includes a first housing and a second housing,
the first opening through which a refrigerant flows is provided in the first housing,
the second opening through which the refrigerant flows is provided in the second housing, and
the first opening and the second opening are connected by the first connecting pipe and the second connecting pipe.

7. The inverter according to claim 3, further comprising:
a stacked cooling unit, wherein
the stacked cooling unit has a plurality of cooling plates between which a heating unit is held and a connecting pipe connected to the adjacent cooling plates, and
the first connecting pipe is connected to a rigid tube that extends from the cooling plate located at an end of the stacked cooling unit.

8. The inverter according to claim 7, wherein
the rigid tube and the cooling plate are made of a same material, and thickness of the cooling plate is thinner than that of the rigid tube.

9. The inverter according to claim 7, further comprising:
a second shaft seal member disposed between an inner peripheral surface at other end of the first connecting pipe and an outer peripheral surface of the rigid tube, wherein the first shaft seal member is disposed between the inner peripheral surface at the other end of the first connecting pipe and an outer peripheral surface at the one end of the second connecting pipe.

* * * * *